Figure 1:
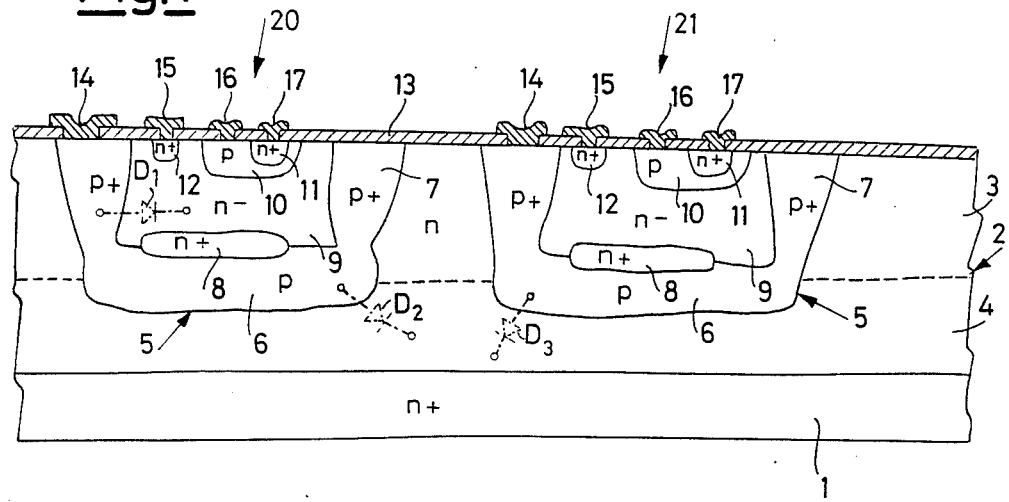

United States Patent [19]
Palara et al.

[11] Patent Number: 4,947,231
[45] Date of Patent: Aug. 7, 1990

[54] INTEGRATED STRUCTURE WITH ACTIVE AND PASSIVE COMPONENTS ENCLOSED IN INSULATING POCKETS AND OPERATING AT HIGHER THAN THE BREAKDOWN VOLTAGE BETWEEN EACH COMPONENT AND THE POCKET. CONTAINING IT

[75] Inventors: Sergio Palara, Acicastello; Mario Paparo, San Giovanni La Punta; Roberto Pellicano', Reggio Calabria, all of Italy

[73] Assignee: SGS-Thomson Microelectronics s.r.l., Milan, Italy

[21] Appl. No.: 259,254
[22] Filed: Oct. 18, 1988
[30] Foreign Application Priority Data
Oct. 30, 1987 [IT] Italy ................................ 22474 A/87
[51] Int. Cl.⁵ .......................................... H01L 27/04
[52] U.S. Cl. ...................................... 357/48; 357/34; 357/51; 357/55
[58] Field of Search ....................... 357/48, 34, 51, 55

[56] References Cited
U.S. PATENT DOCUMENTS

| | | | |
|---|---|---|---|
| 4,646,124 | 2/1987 | Zunino | 357/48 |
| 4,684,970 | 8/1987 | Sloane et al. | 357/48 |
| 4,740,821 | 4/1988 | Bertotti et al. | 357/48 |

FOREIGN PATENT DOCUMENTS 2543364  3/1983  France ................................ 357/48

*Primary Examiner*—Edward J. Wojciechowicz
*Attorney, Agent, or Firm*—Sixbey, Friedman, Leedom & Ferguson

[57] ABSTRACT

The integrated structure consists of circuit components made by diffusion of dopes in a semiconductor substrate. Each of said components is situated inside a respective insulating pocket to which is applied a voltage falling between the minimum and the maximum voltage applied to the components contained in the corresponding pocket.

4 Claims, 5 Drawing Sheets

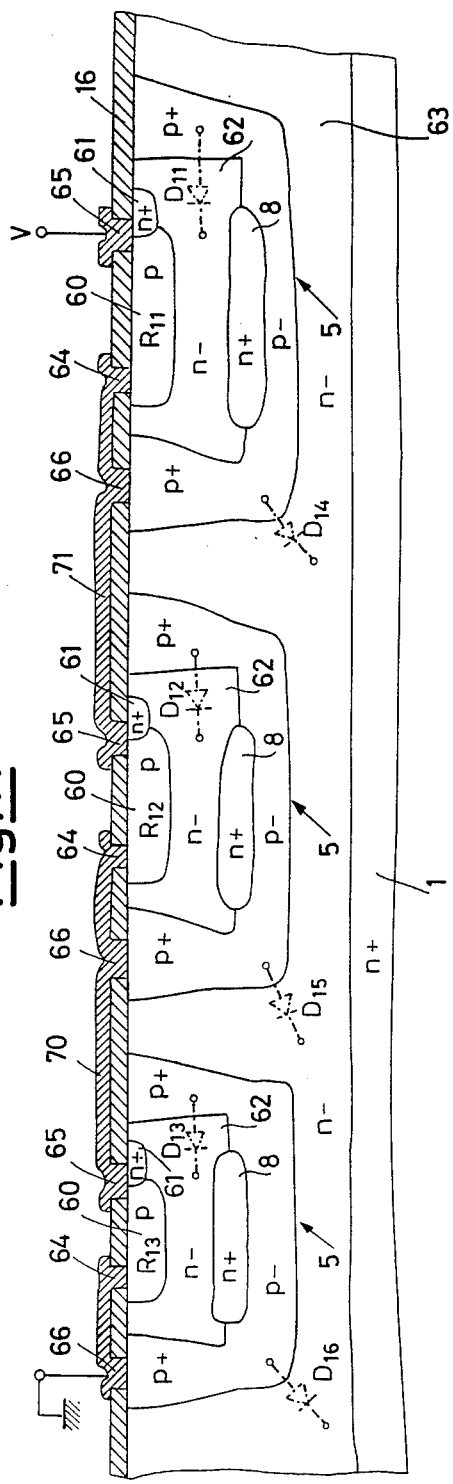

INTEGRATED STRUCTURE WITH ACTIVE AND PASSIVE COMPONENTS ENCLOSED IN INSULATING POCKETS AND OPERATING AT HIGHER THAN THE BREAKDOWN VOLTAGE BETWEEN EACH COMPONENT AND THE POCKET CONTAINING ITp

DESCRIPTION

The present invention relates to an integrated structure with active and passive components enclosed in insulating pockets and operating at a voltage higher, compared to ground, than the breakdown voltage between each component and the pocket containing it.

As known, in integrated circuits of the type having components enclosed in respective insulating pockets the maximum voltage applicable to each component must be lower than the breakdown voltage between that component and the pocket containing it.

An example of a structure having the above characteristic is described in patent no. 19593 A/87, filed by the applicant of the present application, in which the integrated structure displays various components, each one located in a respective insulating pocket surrounded by a substrate, said pocket being electrically floating compared with said underlying substrate and the other components. By such an arrangement a reduction of the overall coupling capacity between each component and the next is obtained with better load transfer between the circuit input and output.

The object of the present invention is to accomplish an integrated structure which could operate with a higher than breakdown voltage between each component and the insulating pocket containing it.

In accordance with the invention said object is achieved by providing an integrated structure consisting of circuital components made by diffusion of dopes in a semiconductor substrate, each of said circuital components being located inside an insulating pocket, characterized in that each insulating pocket is connected to a voltage falling between the minimum and maximum voltages applied to the components contained in the corresponding pocket, the breakdown voltage between the insulating pocket and the surrounding semiconductor substrate being much higher than the breakdown voltage between the insulating pocket and the component contained therein.

In this manner, since the breakdown voltage between the substrate and the insulating pocket is much higher than the breakdown voltage between the pocket and the components contained therein, said components can be supplied with a voltage higher than the breakdown voltage between the pocket and the substrate without any inconvenience. Indeed, the maximum voltage compared to ground applied to a component of the pocket no longer depends on the breakdown voltage between that component and the insulating pocket.

In determining the insulating pockets it is necessary that they be appropriately spaced so that two adjacent insulating pockets separated by a substrate zone constitute a transistor with high breakdown voltage BV wherein the substrate forms the base and the insulating pockets form the emitter and the collector.

Figure 2:
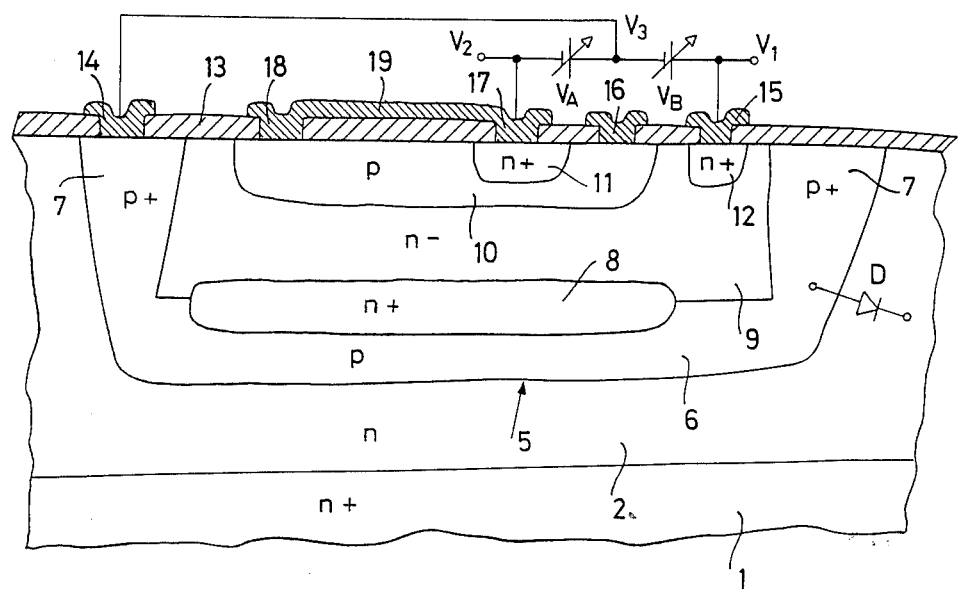
Figure 3:
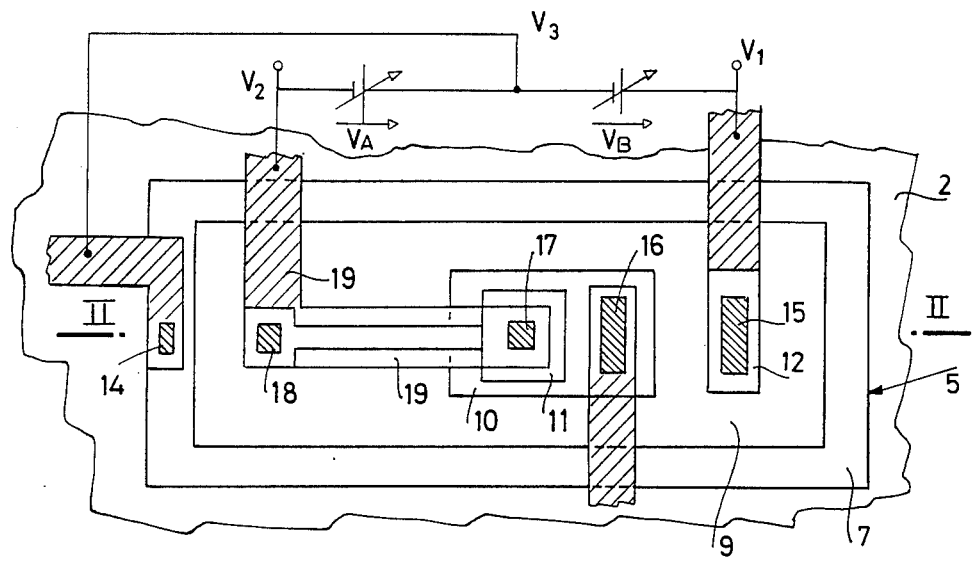
Figure 5:
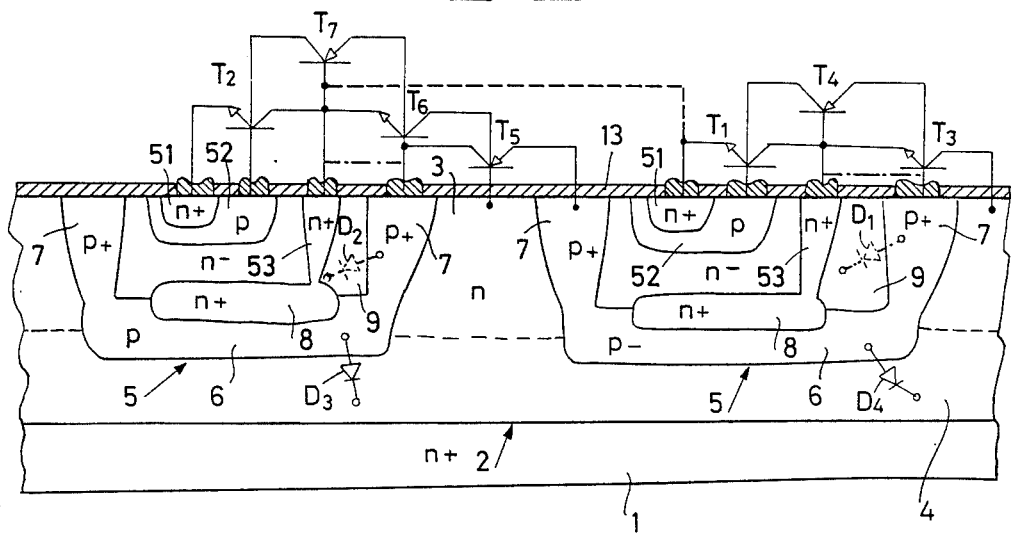
Figure 6:
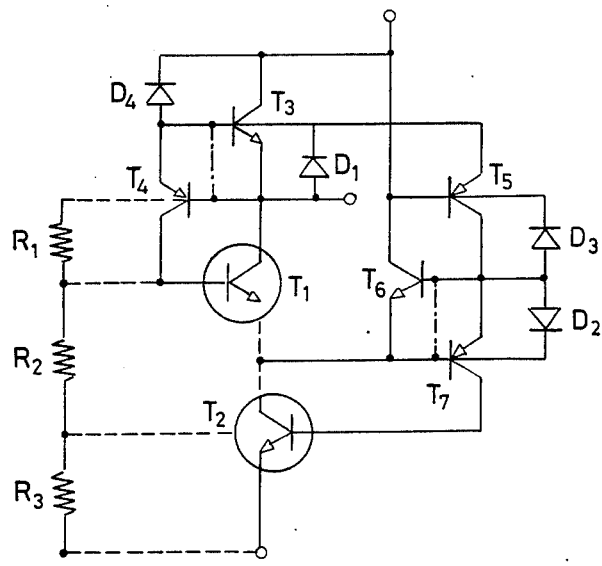
Figure 4:
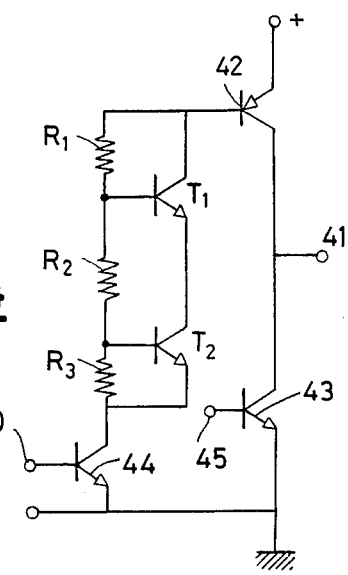
Figure 8:
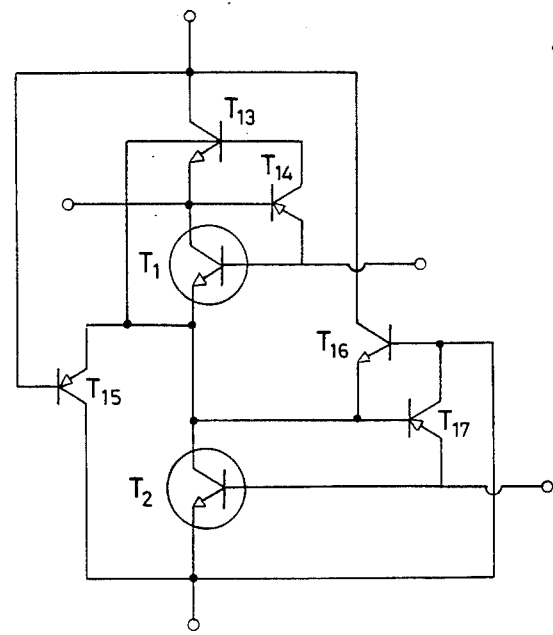
Figure 7:
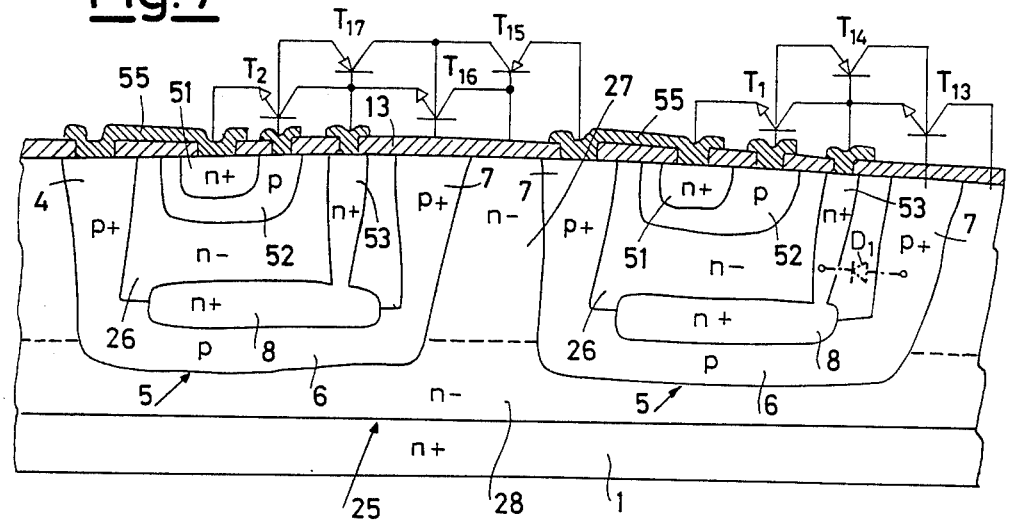
Figure 9:
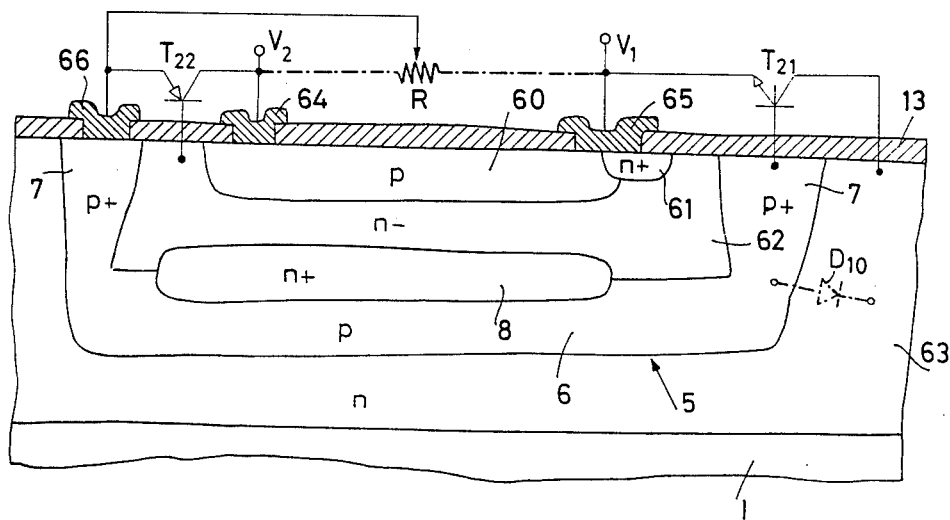

The characteristics of the present invention will be described in greater detail in the following description of its possible forms of practical embodiment illustrated as a nonlimiting example in the annexed drawings wherein FIG. 1 shows a cross section view of an integrated circuit in accordance with the invention, FIG. 2 shows an example of a practical embodiment of one of the components of the structure shown in FIG. 1, FIG. 3 shows a plan view of the component shown in FIG. 2 in which the surface oxide layer has been omitted for clarity, FIG. 4 shows a diagram of a circuit for piloting of the top of a known semibridge, FIG. 5 shows an application of the invention to a part of the circuit shown in FIG. 4, FIG. 6 shows the equivalent circuit of the structure of FIG. 5, FIG. 7 shows another example of application of the invention, FIG. 8 shows the equivalent circuit of the structure shown in FIG. 7, FIGS. 9 and 10 show another example of application of the invention and the related equivalent circuit, and FIGS. 11 and 12 shown another example of application of the invention and the related equivalent circuit.

With reference to FIG. 1 an integrated structure created in accordance with the invention is shown therein.

The structure comprises a semiconductor substrate 1 with $n^{30}$ doping having an epitaxial layer 2 formed in accordance with known techniques with two superimposed layers 3 and 4. Said epitaxial layer 2 contains two separate insulating pockets 5 with p doping in the deeper part 6 and $p^+$ doping in the surface parts 7. Each insulating pocket 5 contains in turn a buried $n^+$ layer 8, an intermediate $n^-$ layer 9, and a p surface area 10. In the latter a first surface zone with $n^+$ doping 11 is provided. A second $n^+$ doped zone 12 is provided within the intermediate area 9. Said doped zones 10, 11, 12 determine inside the pockets 5 respective npn transistors 20 and 21. The surface of the epitaxial layer 3 is covered with a layer of oxide 13. Surface contacts 14, 15, 16 and 17 are placed respectively in positions corresponding with those of one of the surface parts 7 of the insulating pockets 5 and of a collector area on the zone 12, base area on the zones 10, and emitter area on the zones 11.

In the transistor 20 the intermediate layer 9 and the insulating pocket 5 are equivalent to a diode D1 while the insulating pocket 5 and the substrate 1,2 are equivalent to a second diode D2.

Similarly, in the transistor 21 the insulating pocket 5 and the substrate 1, 2 constitute a third diode D3.

For the transistors to operate it is necessary that the breakdown voltage of the diodes D2 be higher than the breakdown voltage of the diode D1. In addition the epitaxial layer 2 must be connected to a positive voltage in relation to the insulating pockets 5 to avoid establishing direct contact of the diode D2 or D3 between pocket 5 and layer 2.

With reference to FIG. 2, the contact of the collector 15 is supplied with a voltage V1 and the emitter contact 17 is supplied with a voltage V2 in which V1 is greater than V2. The contact 14 of the insulating pocket 5 is connected to a voltage V3 falling between V1 and V2, the latter being supplied by two batteries VA and VB, which are variable if V1-V2 is variable The limit of the voltage V1 applicable to the collector 12 in relation to the substrate 1, 2 is given by the breakdown voltage of the diode D indicated in dash & dot lines, which schematically represents the behavior of the insulating pocket 5 and of the epitaxial layer 2 which contains it in the case where V3 =V1. The transistors 20 and 21 shown in FIG. 1 may be accomplished in the form shown in FIGS. 2 and 3 in which another contact 18 is provided in the base zone 10, said contact 18 being connected to the emitter contact 17 by a metallization 19.

The invention can also be applied for example to the pilot circuit of the high part of a semibridge as shown in FIG. 4 The semibridge includes two input terminals 40 and 45 and an output terminal 41, transistors 42 and 43 which determine the semibridge, an input transistor 44 and transistors T1 and T2 to pilot the high part of the semibridge with a voltage shift. The transistors T1 and T2 are combined with resistances R1, R2, R3.

The transistors T1 and T2 are illustrated in FIG. 5 together with the parasite components. As seen, the transistors T1 and T2 consist of npn doped surface zones 51, 52 and 53 in which the surface collector zone 53 is immersed in the intermediate $n^-$layer 9 as far as the buried $n^+$layer 8. The intermediate layer 9 is always contained in a pocket 5, which is in turn immersed in the epitaxial layer 2, which is arranged on the substrate 1.

As seen, numerous parasite components develop. The pockets 5 and the intermediate layers 9 of the two transistors T1 and T2 constitute respectively diodes D1 and D2 just as the pockets 5 and the epitaxial layer 2 constitute the diodes D4 and D3. In this condition the breakdown voltage of the diodes D3 and D4 must of course be higher than the breakdown voltage of the diodes D1 and D2.

The transistor T5 schematizes the pnp transistor made up of the pockets 5 of the two transistors T1 and T2 separated from the layer 2 in which the layer 2 constitutes the base and the pockets 5 constitute the emitter and the collector.

The transistors T3 and T6 schematize the npn transistors made up of the do ed zone 53 which acts as an emitter, the pocket 5 which acts as a base, and the layer 2 which acts as a collector.

The transistors T4 and T7 schematize the pnp transistors made up of the doped zone 52 which acts as an emitter, the zone 53 which acts as a base, and the pocket 5 which acts as a collector.

It should be noted that the pockets 5 must be appropriately spaced so that the parasite transistor T5 will not reach breakdown voltage at the maximum potential difference applied between the two pockets 5.

The equivalent circuital diagram is shown in FIG. 6.

It can be seen from this diagram that the transistors T4 and T1 form an SCR which tends to fire if D4 has a current loss. T7 and T2 also form an SCR which tends to fire if D3 has a current loss. One way of eliminating firing of the parasite SCRs is to short circuit the base and emitter of T4 and T7 as indicated in dash & dot lines in FIGS. 5 and 6, which is equivalent to connecting the pocket 5 to the respective intermediate layer 9 contained therein. The transistor T1 can have on the collector a voltage higher, compared with ground, than the breakdown voltage between the pocket 5 and the intermediate layer; said applicable voltage is limited only by the breakdown voltage between the layer 2 and the insulating pocket 5.

A similar result is obtained if the emitter 51 of the transistor is connected to the respective insulating pocket 5 using an appropriate metallic contact 55 as shown in FIGS. z and 8. In this case the parasite components T13–T7 are polarized in reverse in relation to the parasite components T3–T7 of FIG. 5. The pockets 5 are contained in an $n^-$epitaxial layer 25 and contain an n intermediate layer 26 and a buried layer 8 The layer 25 is in turn formed of the layers 27 and 28.

Another example of application of the invention is shown in FIGS. 9 and 10.

In this case a resistance R consisting of surface zones 60 and 61 with p and $n^+$doping are contained in an intermediate $n^-$layer 62 has been made. A buried $n^+$layer 8 is placed between said intermediate layer 62 and the insulating pocket 5 contained in an epitaxial layer 63 placed on the substrate 1.

At the ends of the resistance R are placed the contacts 64 and 65 and another contact 66 is placed on one of the two surface parts 7 of the pocket 5. The contact 66 is used for connection of the pocket 5 to one of the ends of the resistance or to an intermediate point thereon. The pocket 5 and the epitaxial layer 63 constitute the diode D10 and in addition there are present the parasite transistors T21 and T22 in which the transistor T21 is npn with the emitter consisting of the zone 61, the base of the pocket 5 and the collector of the epitaxial layer 63, and the transistor T22 is pnp in which the base consists of the intermediate layer 62 and the collector and emitter of the pocket 5 and the zone 60 respectively. The maximum voltage V1 applicable to the resistance is limited by the breakdown voltage of the diode D10.

If it is desired to apply to a resistance a voltage V higher than the breakdown voltages of the equivalent diodes, i.e. intermediate layer 62/insulating pocket 5 and intermediate layer 62/resistance R respectively and the breakdown voltage of the equivalent diode insulating pocket 5/epitaxial layer 63 is higher than said voltage V to be applied, the single resistance can be broken up into several resistances connected in series, e.g. three resistances R11, R12 and R13 as shown in FIGS. 11 and 12 (by means of associated connections 70 and 71). In this manner, to each resistance will be distributed a voltage lower than the breakdown voltages of the intermediate layer/resistance and insulating pocket/intermediate layer diodes. As can be seer, each pocket 5 has a contact 66 connected to one end 64 of the resistance contained in that pocket. As an alternative the contact 66 can also be connected to the end 65 or to any intermediate point of the resistance.

The diodes D11, D12 and D13, each of which is made up of the pocket 5 and the intermediate layer 62 contained therein, have a breakdown voltage lower than that of the diodes D14, D15 and D16, each of which is made up of the epitaxial layer 63 and the pocket 5.

In this manner, in each component the supply voltage V is independent of the breakdown voltage of the diode made up of the insulating pocket 5 and the intermediate layer 62.

We claim

1. An integrated circuit structure formed by a plurality of circuit components each of which is included in an insulated pocket defined within a respective surrounding doped insulating band formed in an oppositely-doped semiconductor substrate biassed with a substrate voltage and has opposed ends biassed with respective higher and lower voltages, the arrangement being such as to define a first breakdown voltage between each insulating band and the substrate and a second breakdown voltage between the same insulating band and the circuit component contained therein, the first breakdown voltage being much higher than the second breakdown voltage, wherein each insulating band is biassed with a band voltage provided by the respective component and comprised between said higher and lower voltages of the respective component, said band voltage differing from said higher voltage by a value greater than the difference between said higher voltage and the substrate voltage.

2. Integrated structure in accordance with claim 1 characterized in that the insulating pocket is connected to the emitter of a transistor contained therein.

3. Integrated structure in accordance with claim 1 characterized in that the insulating pocket is connected to one end of a resistance or to an intermediate point on said resistance.

4. Integrated structure in accordance with claim 1 comprising at least two circuit components each provided with an insulating pocket characterized in that said pockets are spaced in such a manner as to not reach the breakdown voltage for a preset maximum potential differential applied between the two pockets.

* * * * *

UNITED STATES PATENT AND TRADEMARK OFFICE
CERTIFICATE OF CORRECTION

PATENT NO. : 4,947,231

DATED : August 7, 1990

INVENTOR(S) : Sergio Palara, Mario Paparo, Roberto Pellicano'

It is certified that error appears in the above-identified patent and that said Letters Patent is hereby corrected as shown below:

Title page:

[73] Assignee: SGS-Thomson Microelectronics s.r.L., Agrate Brianza (Milano)

Signed and Sealed this

Second Day of June, 1992

Attest:

DOUGLAS B. COMER

Attesting Officer

Acting Commissioner of Patents and Trademarks